US009921377B2

(12) United States Patent
Rosenberg et al.

(10) Patent No.: US 9,921,377 B2
(45) Date of Patent: Mar. 20, 2018

(54) INTERPOSER REGISTRATION ELEMENTS

(71) Applicant: HEWLETT PACKARD ENTERPRISE DEVELOPMENT LP, Houston, TX (US)

(72) Inventors: Paul K Rosenberg, Sunnyvale, CA (US); Sagi V Mathai, Sunnyvale, CA (US); Michael Renne Ty Tan, Menlo Park, CA (US)

(73) Assignee: Hewlett Packard Enterprise Department LP, Houston, TX (US)

( * ) Notice: Subject to any disclaimer, the term of this patent is extended or adjusted under 35 U.S.C. 154(b) by 0 days.

(21) Appl. No.: 15/325,086

(22) PCT Filed: Jul. 31, 2014

(86) PCT No.: PCT/US2014/049130
§ 371 (c)(1),
(2) Date: Jan. 10, 2017

(87) PCT Pub. No.: WO2016/018363
PCT Pub. Date: Feb. 4, 2016

(65) Prior Publication Data
US 2017/0168251 A1   Jun. 15, 2017

(51) Int. Cl.
*G02B 6/36* (2006.01)
*G02B 6/42* (2006.01)
*H01L 23/00* (2006.01)

(52) U.S. Cl.
CPC ......... *G02B 6/4228* (2013.01); *G02B 6/3652* (2013.01); *G02B 6/4231* (2013.01); *H01L 24/97* (2013.01); *G02B 6/4274* (2013.01)

(58) Field of Classification Search
CPC .. G02B 6/4228; G02B 6/4231; G02B 6/3652; H01L 24/93; H01L 24/97
(Continued)

(56) References Cited

U.S. PATENT DOCUMENTS 4,565,314 A * 1/1986 Scholz ............... H01L 24/81
                                                  228/180.21
5,647,042 A * 7/1997 Ochiai ............... G02B 6/421
                                                  385/56
(Continued)

FOREIGN PATENT DOCUMENTS

JP    2005141066 A    6/2005
WO    WO 2012/096651 A1 * 7/2012 ............... G02B 6/42

OTHER PUBLICATIONS

Benjamin, Y. et al., Assembly Development of 1.3 Tb/s Full Duplex Optical Module, IEEE, Electronic Components & Technology Conference, May 28-31, 2013, pp. 292-296.
(Continued)

*Primary Examiner* — Robert Tavlykaev
(74) *Attorney, Agent, or Firm* — Hewlett Packard Enterprise Patent Department

(57) ABSTRACT

A substrate comprises multiple interposers. Each interposer includes interposer elements, where an optical device is coupled to at least some of the interposer elements; two passages formed through the interposer, where each passage is registered with respect to the interposer elements; two blind holes formed in a surface of the interposer, where each blind hole is concentric with a different passage; two annular troughs formed in the surface, each concentric with a different passage, and an annular area separates the annular troughs from an outer diameter of the corresponding concentric passage; and two spherical registration elements, where each registration element is positioned on uncured adhesive on one of the annular areas, where the passages enable a vacuum to be drawn through such that the registration elements are pulled toward the surface of the interposer to self-align to the inner diameter of the blind holes.

15 Claims, 11 Drawing Sheets

(58) Field of Classification Search
USPC .................................................. 385/88–91
See application file for complete search history.

(56) References Cited

U.S. PATENT DOCUMENTS

| | | | | |
|---|---|---|---|---|
| 5,749,614 | A * | 5/1998 | Reid | B65G 47/91 414/627 |
| 5,808,793 | A | 9/1998 | Chang et al. | |
| 5,941,449 | A * | 8/1999 | Le Coz | B23K 3/0623 228/212 |
| 6,100,175 | A * | 8/2000 | Wood | H01L 21/4853 228/180.1 |
| 6,512,861 | B2 * | 1/2003 | Chakravorty | G02B 6/42 385/14 |
| 6,526,205 | B1 | 2/2003 | Wilson et al. | |
| 6,799,897 | B2 | 10/2004 | Sherrer | |
| 6,965,166 | B2 * | 11/2005 | Hikita | H01L 23/36 257/777 |
| 8,554,025 | B2 | 10/2013 | Drost et al. | |
| 8,669,633 | B2 | 3/2014 | Van Arendonk | |
| 2005/0029550 | A1 * | 2/2005 | Lee | H01L 21/486 257/202 |
| 2006/0274997 | A1 * | 12/2006 | Furuno | G02B 6/4204 385/89 |
| 2006/0283012 | A1 * | 12/2006 | Lee | B23K 3/0623 29/846 |
| 2007/0091062 | A1 | 4/2007 | French et al. | |
| 2008/0038455 | A1 | 2/2008 | Levich et al. | |
| 2009/0250249 | A1 | 10/2009 | Racz et al. | |
| 2012/0319265 | A1 | 12/2012 | Yoon et al. | |
| 2014/0013174 | A1 | 1/2014 | Whetsel | |
| 2016/0062052 | A1 * | 3/2016 | Huang | G02B 6/3839 385/78 |

OTHER PUBLICATIONS

PCT/ISA/KR, International Search Report dated Apr. 29, 2015, PCT/US2014/049130, 10 pages.

* cited by examiner

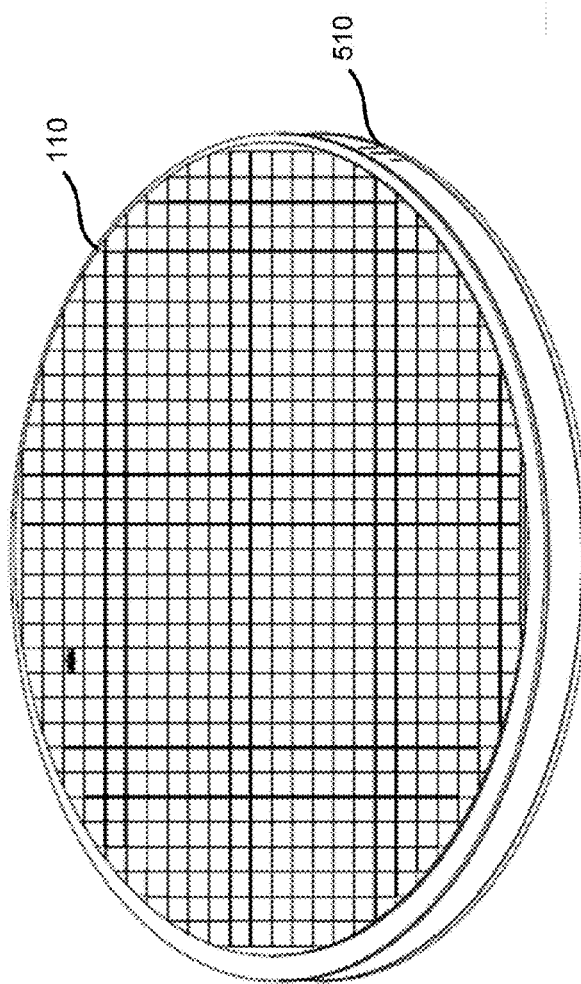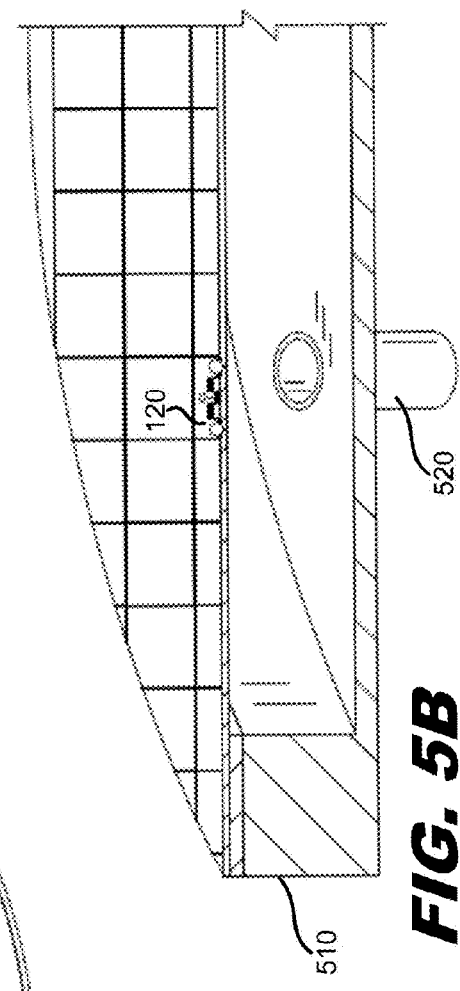

INTERPOSER REGISTRATION ELEMENTS

BACKGROUND

Server and networking systems are incorporating co-packaging of application-specific integrated circuit (ASIC) and optical communication components. With co-packaging, ASIC and optical components are assembled in very close proximity with spacings as close as one mm, or less. In some cases, active optical devices, such as lasers and photodetectors, are being assembled directly onto ASIC chips.

Compact electrical circuit board substrates, called interposers, can be useful in assembling co-packaged optics. The interposer serves as an intermediate assembly structure onto which multiple active optical devices can be solder-attached and tested, with a high yield of good components.

BRIEF DESCRIPTION OF THE DRAWINGS

The accompanying drawings illustrate various examples of the principles described below. The examples and drawings are illustrative rather than limiting.

FIG. 5A depicts an example wafer substrate on a vacuum manifold. FIG. 5B depicts a close-up of a section of the example wafer substrate on the vacuum manifold.

DETAILED DESCRIPTION

Optical alignment of active optical devices (AODs), such as lasers and photodetectors, to other optical elements, such as optical lenses and optical fibers can be a slow, expensive, and laborious process. With active optical alignment, the coupling of light emitted from an AOD light source to another optical element or the coupling of light from an optical element to a detecting AOD is monitored to maximize the coupled light. When the coupling of light is sufficient, the elements are held in place and positionally fixed using glue, laser welding, or other similar means. However, with active optical alignment, expensive, high accuracy alignment equipment is used to align the parts and to measure the coupled light signal. Additionally, active optical alignment is performed one device at a time.

The techniques presented below enable the alignment of multiple optical devices with passive optical alignment. Typical limitations arising from using glue or other adhesive material or joining material to hold very small components is overcome. Also, movement of the adhesive controlled by fabricating specific features on the interposer surface.

Figure 1:
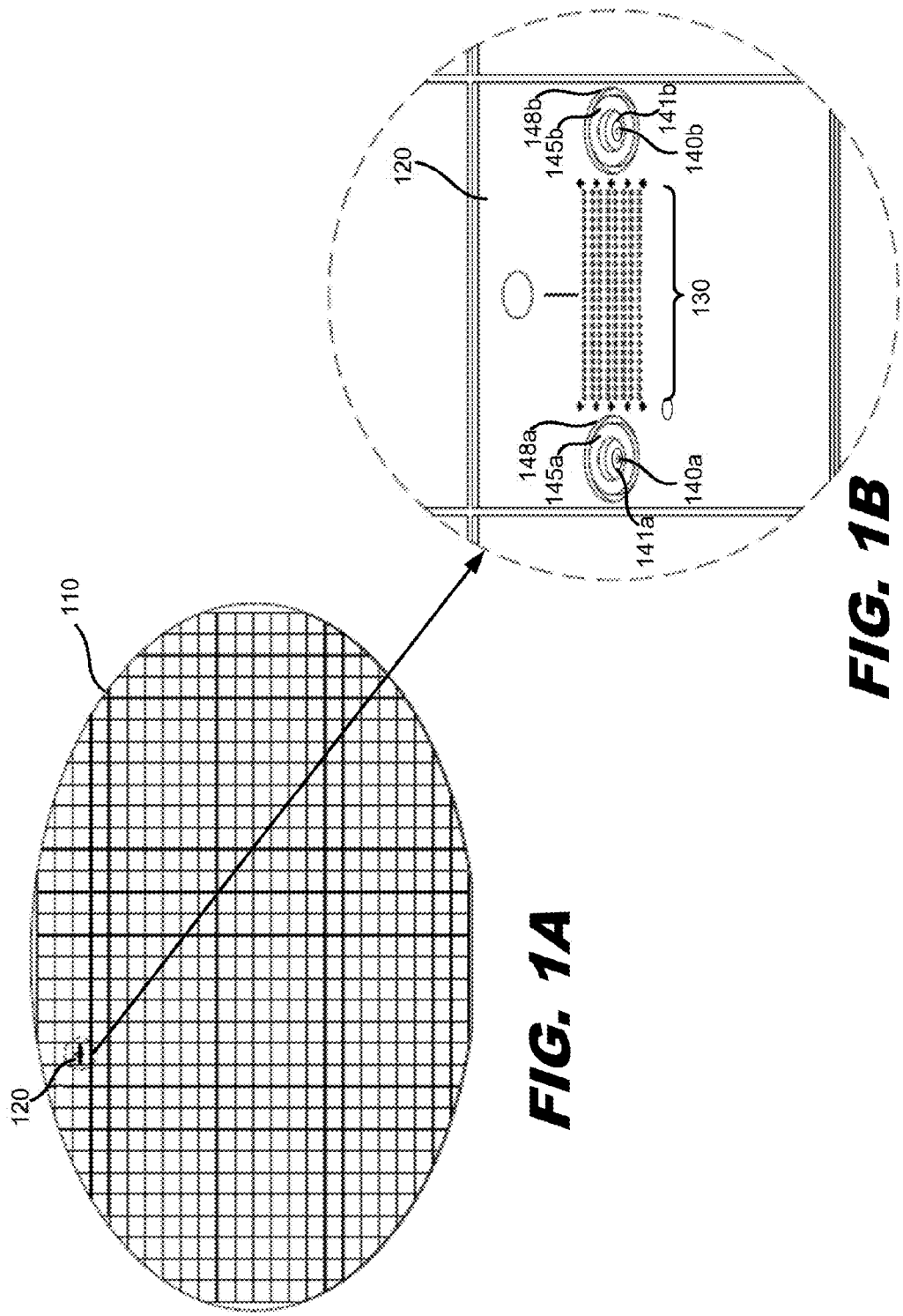
FIG. 1A depicts an example wafer substrate having multiple interposers.
FIG. 1B depicts a close-up view of an example interposer on the wafer substrate.

FIG. 1A depicts an example wafer substrate 110. The wafer substrate 110 can be diced into multiple smaller substrates or interposers, such as interposer 120. In some implementations, the wafer substrate 110 can be divided into several hundred or even thousands of interposers, depending on the size of the substrate. The wafer substrate can be any type of material, such as silicon, glass, ceramic, and organic materials. The substrate can be of any shape such as, but not limited to a circle, square, and rectangle.

FIG. 1B depicts a close-up view of example interposer 120 on the wafer substrate 110. Substrate elements 130, also referred to as interposer elements, can include electrically conductive flip chip pads and through substrate vias (TSVs). The flip chip pads can be used to solder-attach AODs 210a, 210b (shown in FIG. 2) to the interposer 120. The flip chip pads connect through vias or other means to a pad pattern on the other side of the interposer 120 so that electrical connection to the AODs 210a, 210b is made by electrical contact to the pad pattern on the opposite side of the interposer substrate 120. TSVs can be used to send signals, such as high speed electrical signals, up through the interposer 120 to the AODs 210a, 210b and to bring signals down through the interposer 120 from the AODs 210a, 210b. ASICs and passive electrical devices can also be coupled to the substrate elements 130 on the interposer 120. It should be noted that TSVs are not required in order to electrically connect the interposer to a second substrate or printed circuit board. The flip chip pads can be connected to traces on the side of the substrate to which the AODs are coupled. These traces typically fan out to the periphery of the interposer 120, where electrical connection can be made by a variety of known methods.

Also shown in the example of FIG. 1B are through holes 140a, 140b, also referred to as passages or apertures, in the interposer 120 and larger blind holes 141a, 141b that are concentric to the through holes 140a, 140b. The through holes 140a, 140b are located with high accuracy relative to the substrate elements 130. The through holes 140a, 140b can be formed, for example, by mechanical drilling, laser ablation, sand blasting, dry etching, or wet etching. Each of the through holes 140a, 140b can be fabricated with a constant diameter or have a varying diameter, for example, a larger diameter on the side of the interposer 120 where the substrate elements are located (top side) and transitioning to a smaller diameter on the other side of the interposer 120 (bottom side). A typical range of diameters on the top side is between 0.1 mm and 0.8 mm, however, diameters outside this range can also be used. Independent of the method used to fabricate the through holes 140a, 140b, they should be registered precisely to the substrate elements 130.

Figure 6:
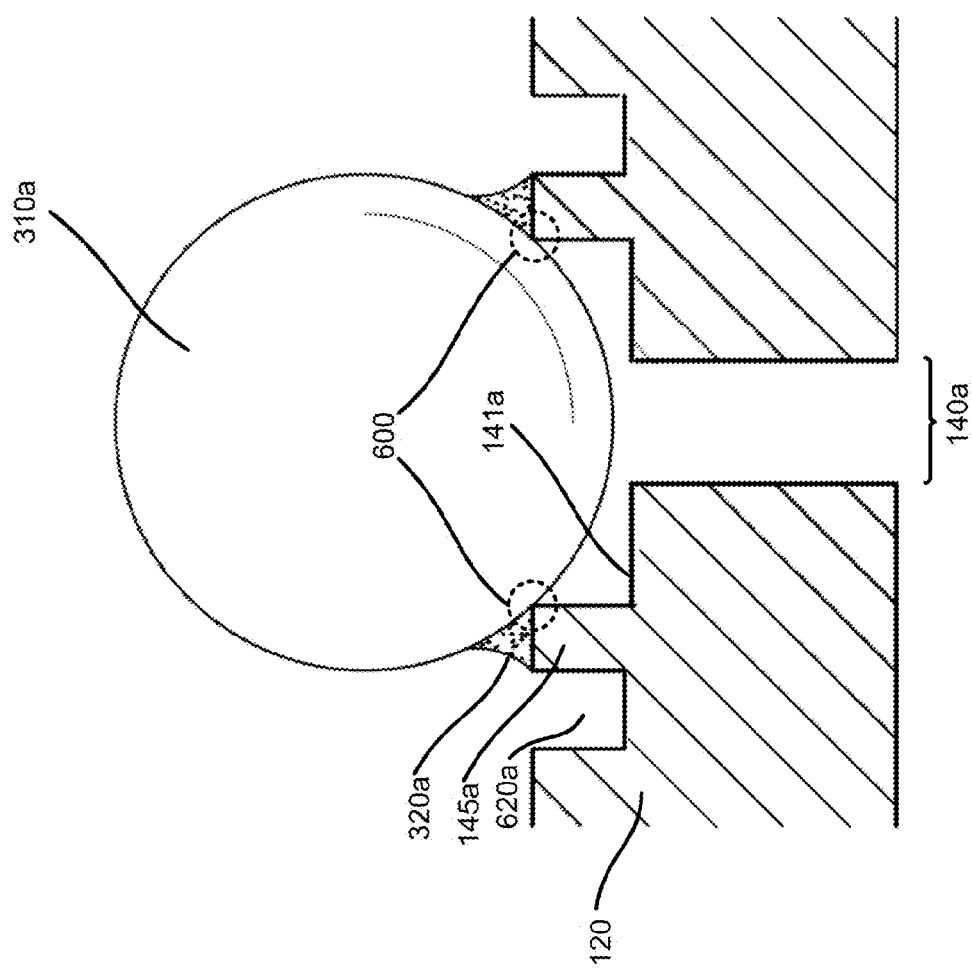
FIG. 6 depicts a cross-section of an example spherical registration element coupled to the interposer.

Concentric to the through holes 140a, 140b are rings 145a, 145b. The rings 145a, 145b are geometrical features on the surface of the interposer 120, where each ring has an inner diameter and an outer diameter. The rings 145a, 145b are precisely aligned to the substrate elements 130. The inner diameter of the rings 145a, 145b coincide with the outer diameter of the blind holes 141a, 141b. Additionally, another channel of interposer surface material is removed around the outer diameter of the rings 145a, 145b. The rings 145a, 145b are sized to accommodate a precise amount of adhesive material. FIG. 6 shows a cross-section of example spherical registration element 310a coupled to the interposer 120.

Figure 2:
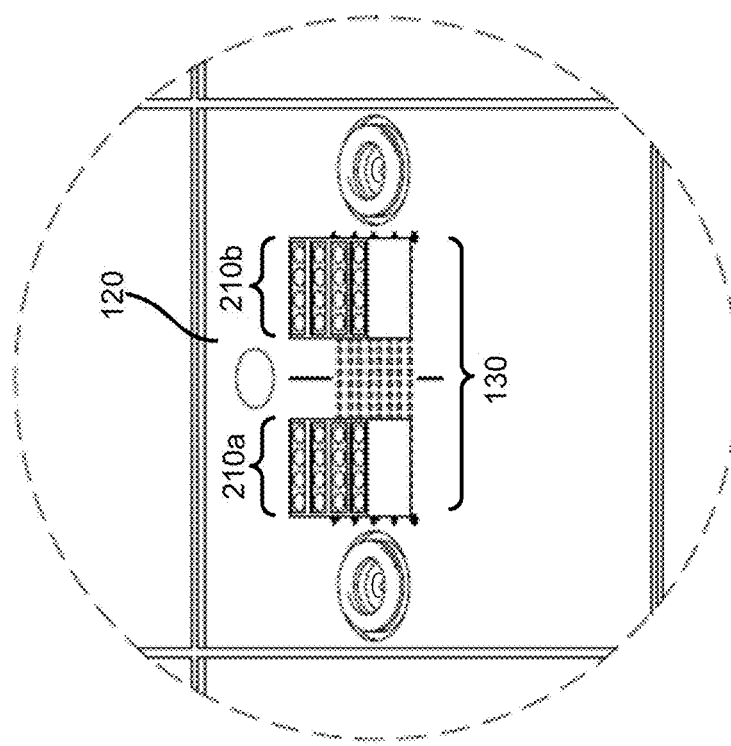
FIG. 2 depicts an example interposer with two optical devices and interposer features used to attach registration elements to the interposer.

In the example of FIG. 2, example interposer 120 is shown with two sets of optical devices 210a, 210b attached to substrate elements 130. The optical devices 210a, 210b can include active optical devices, such as arrays of lasers and photodetectors. While multiple optical devices 210a, 210b are shown in FIG. 2, a single optical device can be attached to the interposer 120 using one or more of the substrate elements 130.

Figure 3:
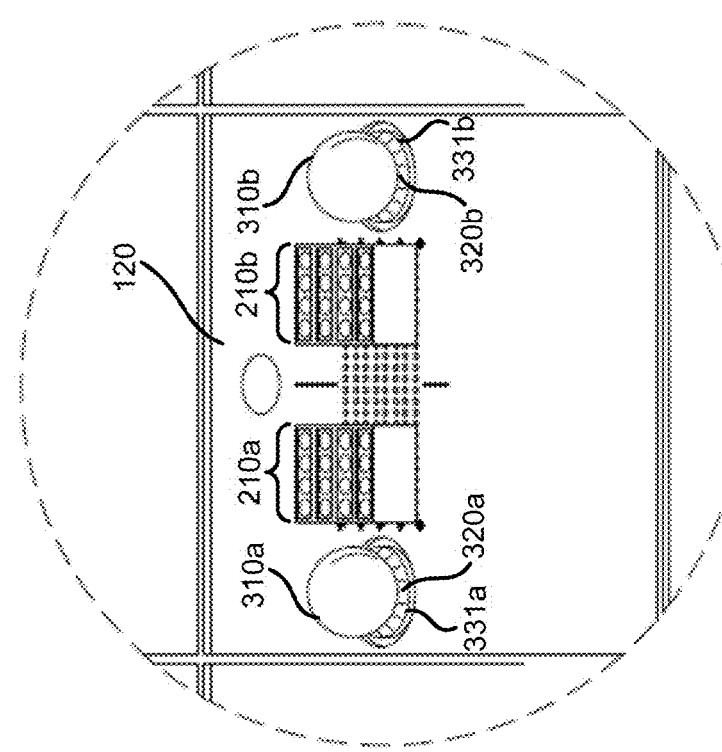
FIG. 3 depicts an example interposer with two optical devices and two registration elements attached to the interposer.

In the example of FIG. 3, registration elements 310a, 310b, also referred to as registration objects, are shown attached to the interposer 120 with adhesive material 320a, 320b. Adhesive material 320a, 320b is applied to the rings 145a, 145b. The adhesive material 320a, 320b should have an appropriate rheology such that when it encounters an edge of the ring 145a, 145b, it anchors onto the edge without overflowing the ring, either beyond the inner diameter or the outer diameter 331a, 331b. Thus, the ring 145a, 145b limits the area where the adhesive material 320a, 320b can flow.

The registration elements 310a, 310b shown in FIG. 3 are precision spheres with a precision diameter that will be used for aligning one or more optical elements on an optical receptacle to one or more of the active optical devices 210a, 210b. The registration elements 310a, 310b can be made of glass and, typically, have a diameter between 0.5 mm and 1 mm. However, the registration elements 310a, 310b can be made of any other suitable material with an appropriate diameter.

The registration elements 310a, 310b are placed on top of the adhesive material 320a, 320b prior to curing. The volume and rheology of the adhesive material 320a, 320b should be selected such that the adhesive material 320a, 320b does not flow above the equator of the spherical registration elements 310a, 310b to prevent interference with assembly of the optical receptacle (to be described below). The registration elements 310a, 310b will self-align to the blind holes 141a, 141b during the application of vacuum prior to curing the adhesive.

Figure 4A:
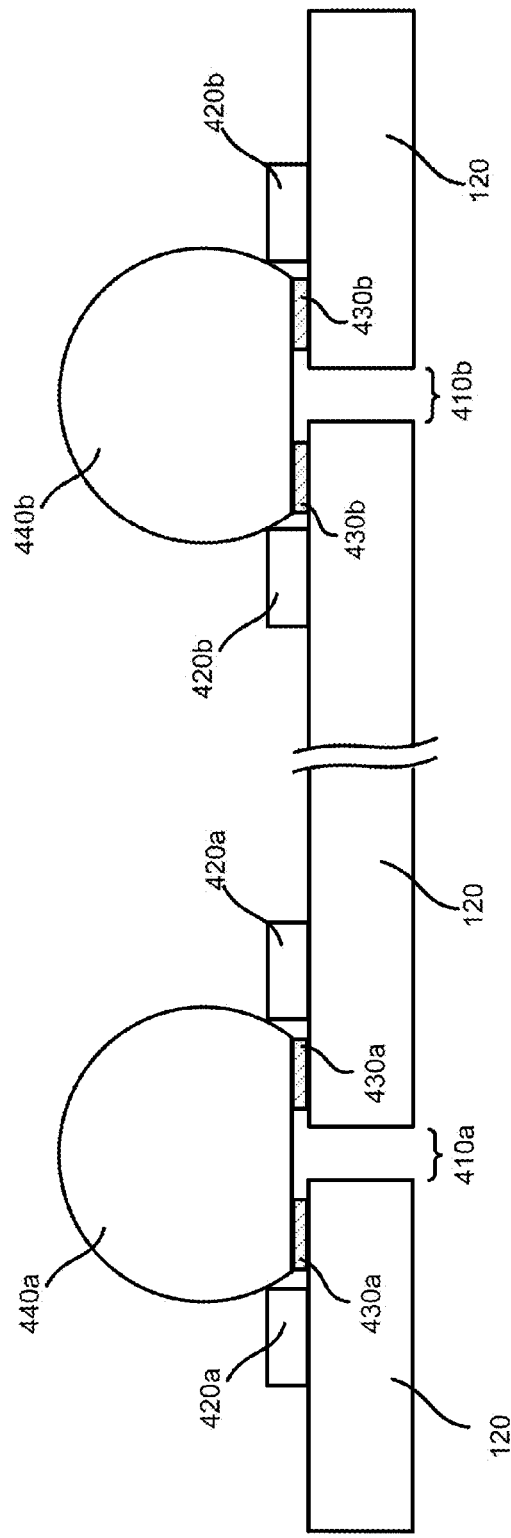
FIGS. 4A and 4B depict example alternative attachments of a partial sphere registration element to the interposer.
Figure 4B:
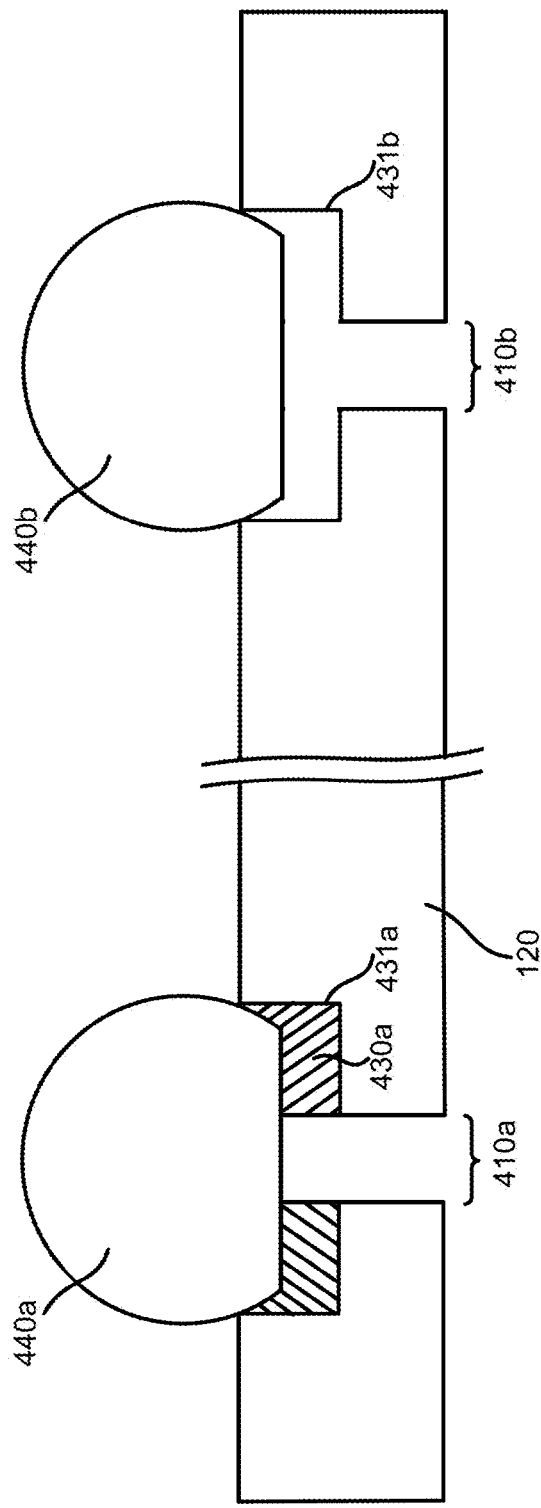

FIG. 4A depicts a cross-section of an example alternative attachment of partial sphere registration elements 440a, 440b to the interposer 120. In this case, the registration elements 440a, 440b can be a precision partial sphere that has a flat surface, where the flat surface is in contact with the adhesive material 430a, 430b. The partial sphere portion of the registration elements 440a, 440b should be at least a hemisphere (half a sphere) for use as an alignment feature for the optical receptacle assembly. The interposer substrate 120 has raised rings 420a, 420b, and adhesive material 430a, 430b is placed on the surface of the interposer 120 within the raised rings 420a, 420b and outside of the through holes 410a, 410b. Then the flat surfaces of the registration elements 440a, 440b are positioned on the adhesive material 430a, 430b. In some implementations, as shown in the example of FIG. 4B, a blind hole 431a, 431b concentric with each of the through holes 410a, 410b can be etched in the interposer 120. Adhesive material 430a can be placed on the floor of the blind hole 431a. To show blind hole 431b more clearly, adhesive material has not been shown in blind hole 431b. In this implementation, the raised rings 420a, 420b are not present.

The through holes 140a, 140b, 410a, 410b over which the registration elements 310a, 310b, 440a, 440b are positioned are used for drawing the registration elements 310a, 310b, 440a, 440b toward the interposer 120. FIG. 5A depicts an example wafer substrate 110 on a vacuum manifold 510. FIG. 5B depicts a close-up of a section of the example wafer substrate 110, including example interposer 120, on the vacuum manifold 510. Vacuum is drawn through one or more vacuum ports 520. A single vacuum port 520 is shown in FIG. 5B for clarity. The vacuum manifold 510 can have one or more thin ribs (not shown) to support the wafer substrate 110 to prevent the wafer substrate 110 from warping while drawing the vacuum. For example, the ribs can be in the form of cross bars on the vacuum manifold 510.

When vacuum is drawn through the vacuum ports 520, the vacuum pulls down on the registration elements 310a, 310b through the through holes 140a, 140b until the spherical registration elements 310a, 310b make line contact with the inner diameter of the rings 145a, 145b. FIG. 6 depicts a cross-section of example spherical registration element 310a coupled to the interposer 120. The differential pressure (between the atmosphere on top of the sphere and the vacuum on the lower side of the sphere) applied to registration element 310a causes the registration element to seat against the inner diameter of the annular ring 145a, as shown within the dotted circles 600. This provides precise positioning of the registration element 310a and prevents the adhesive material 320a from entering the through holes 140a. Note that the rheology of the adhesive material 320a causes it to wet to the horizontal annular surface and the lower hemisphere of the registration element. It does not flow into the channel 620a surrounding the ring 145a.

Similarly, for the case of partial sphere registration elements 440a, 440b, as shown in the examples of FIGS. 4A and 4B, the registration elements 440a, 440b will be pulled toward the interposer 120 when the vacuum is drawn through the through hole 410a, 410b. In the example of FIG. 4A, the partial sphere registration elements 440a, 440b will be pulled downward by the vacuum until making line contact with the inner diameter of the raised rings 420a, 420b. In the example FIG. 4B, the partial sphere registration elements 440a, 440b will be pulled downward in a similar fashion to make line contact with the perimeter of blind holes 431a, 431b.

With both types of registration elements, spherical 310a, 310b, or partial spheres 440a, 440b, the adhesive material 320a, 320b, 430a, 430b can be cured while the vacuum is applied to the wafer substrate 110. The vacuum can be applied prior to, during part of, or during all of the curing process. By using the vacuum to draw the registration elements 310a, 310b, 440a, 440b toward the interposer 120, there is no need to press the registration elements 310a, 310b, 440a, 440b down into their final positions, nor will the registration elements 310a, 310b, 440a, 440b float on the adhesive material out of position. Additionally, the flow of the adhesive material 320a, 320b, 430a, 430b is controlled by the rings 145a, 145b, 420a, 420b. Note that the registration elements 310a, 310b, 440a, 440b on the various multiple interposers that make up the wafer substrate 110 can be vacuum drawn simultaneously while the wafer substrate is attached to the vacuum manifold 510. Moreover, the adhesive material 320a, 320b, 430a, 430b attaching the registration elements 310a, 310b, 440a, 440b to the multiple interposers can be cured simultaneously on the multiple interposers. Thus, wafer scale assembly of the registration elements 310a, 310b, 440a, 440b can be performed with these techniques. Additionally, the AODs 210a, 210b can be positioned on the substrate elements 130 as part of the wafer scale assembly process for the optical components. The material properties of the adhesive are chosen to withstand multiple solder reflow steps.

Additionally, because the registration elements 310a, 310b are spheres, and the partial sphere registration elements 440a, 440b are at least hemispheres facing away from the interposer 120, they are useful as alignment features for accurately positioning an optical receptacle. The upper hemispheres of the registration elements 310a, 310b, 440a,

440b have a capture range that is at least ⅓ of the sphere diameter, that is, the optical receptacle can be mis-aligned by ⅓ of the sphere diameter and still align properly. Additionally, the smooth precision spherical surface of the registration elements 310b, 310b, 440a, 440b will not generate contamination that might deposit onto a surface and block light from an optical element.

Figure 7:
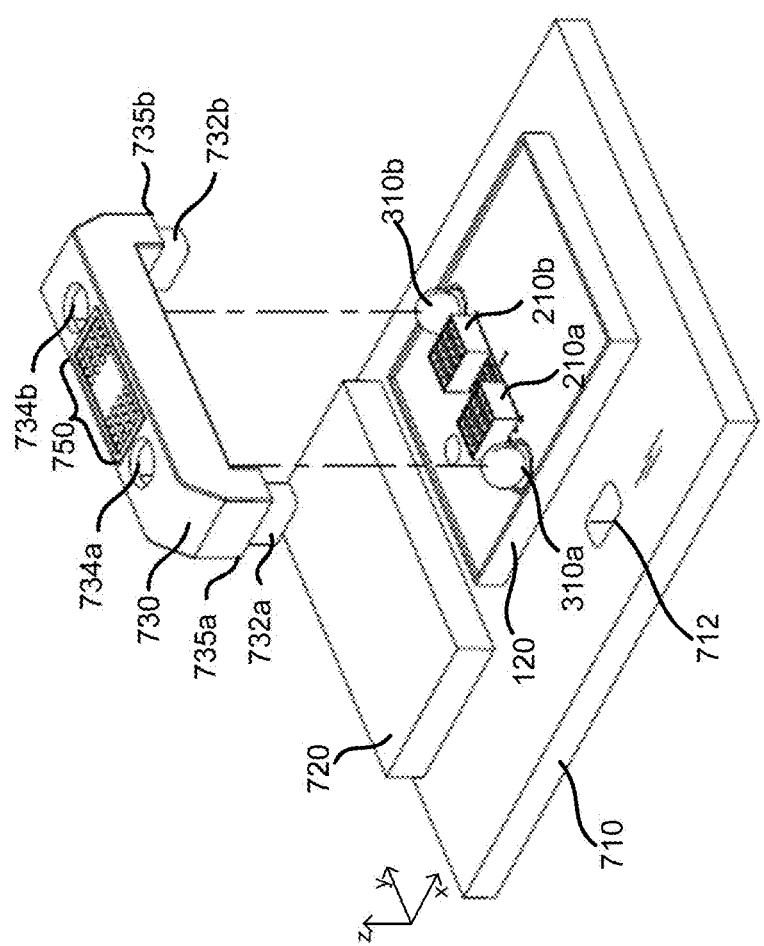
FIG. 7 depicts an example interposer and ASIC coupled to a base substrate and the alignment of an optical receptacle having an optical element with the interposer.

FIG. 7 depicts an example of an interposer 120 and ASIC 720 coupled to a base substrate 710, such as a printed circuit board. The interposer 120 and the ASIC 720 can be coupled, for example, by flip chip reflow or electrical connector. Coupled to the optical receptacle 730 are one or more optical elements 750 to be aligned with the one or more active optical devices 210a, 210b. The optical receptacle 730 has two openings 734a, 734b that are cylindrical and have the same diameter and center-center spacing as the registration elements 310a, 310b that have been assembled on the interposer 120 with respect to the substrate elements 130. The openings 734a, 734b shown in the example of FIG. 7 are cylindrical openings, however, the openings 734a, 734b can have other shapes, such as conical openings or pyramidal openings. Likewise, one opening can be cylindrical in cross section and the second opening can have a slot-shaped cross section with the long axis of the slot parallel to a line connecting the centers of the registration elements. This arrangement of a hole and slot makes it easier to attach the receptacle to the registration elements while maintaining the same alignment accuracy as two cylindrical holes. By aligning the openings 734a, 734b in the optical receptacle 730 with the spherical registration elements 310a, 310b on the interposer 120, each optical element 750 is brought into precise alignment with its corresponding active optical device 210a, 210b.

The optical receptacle 730 has two legs or pins 732a, 732b for plugging into holes 712 that are cut into the base substrate 710. The holes 712 and legs 732a, 732b do not have to be precisely located because the precision alignment is performed by the registration element 310a, 310b alignment features and the openings, e.g., precision cylindrical and slot-shaped openings, 734a, 734b in the optical receptacle 730. The precision openings 734a, 734b in the optical receptacle 730 mate with the registration elements 310a, 310b to provide alignment in the x and y directions of the optical elements 750 to the active optical devices 210a, 210b.

Figure 8:
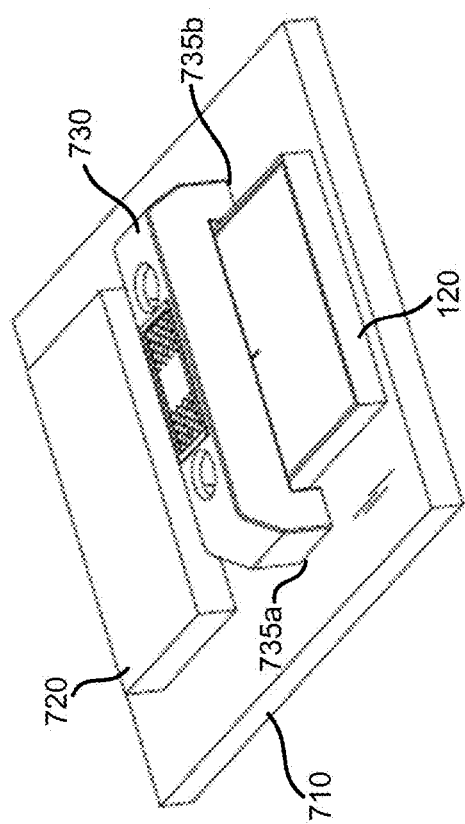
FIG. 8 depicts an example interposer optical receptacle seated on the base substrate.

The optical receptacle 730 also has two shoulders 735a, 735b above the legs 732a, 732b that are wider than the legs 732a, 732b. The shoulders 735a, 735b bottom out onto the top surface of substrate 710, thereby determining the spacing in the z-direction of the optical elements 750 from the active optical devices 210a, 210b coupled to the interposer 120. It is anticipated that adhesive will be dispensed and cured around the perimeter of the shoulders where they contact the surface of substrate 710. This adhesive bonds the base of the receptacle shoulders to the substrate 710 and provides stress relief so that a load on the optical receptacle 730 does not pass directly to the interposer 120. For example, interposer 120 is stress relieved from the load from an optical connector (not shown) that mates to the optical receptacle 730. The optical connector may have pins that mate to the openings, 734a and 734b. The optical connector may be detachable from or permanently attached to the optical receptacle 730. FIG. 8 depicts the example optical receptacle 730 fully seated on the base substrate 710.

In another implementation, the legs 732a, 732b of the optical receptacle 730 can insert into cuts on the interposer 120, and the shoulders 735a, 735b of the optical receptacle 730 bottom out onto the top surface of the substrate 710 to prevent the optical receptacle 730 from being seated too closely to the interposer 120 and the spacing between the optical elements 750 and the active optical devices 210a, 210b is controlled.

The one or more optical elements 750 can include optical fibers, micro-optical elements, a large aperture, optically transparent windows, low optical loss plastics, filter components, components that perform more complicated functions, such as a multiplexing or demultiplexing, and/or any other type of components. The positions of the optical elements 750 in the optical receptacle 730 are aligned precisely with respect to the openings 734a, 734b to ensure that the optical elements 750 align with the AODs 210a, 210b when the optical receptacle 730 is seated. The optical receptacle 730 can protect the elements on the interposer 120 from the environment, handling, and fabrication or assembly processes.

Figure 9A:
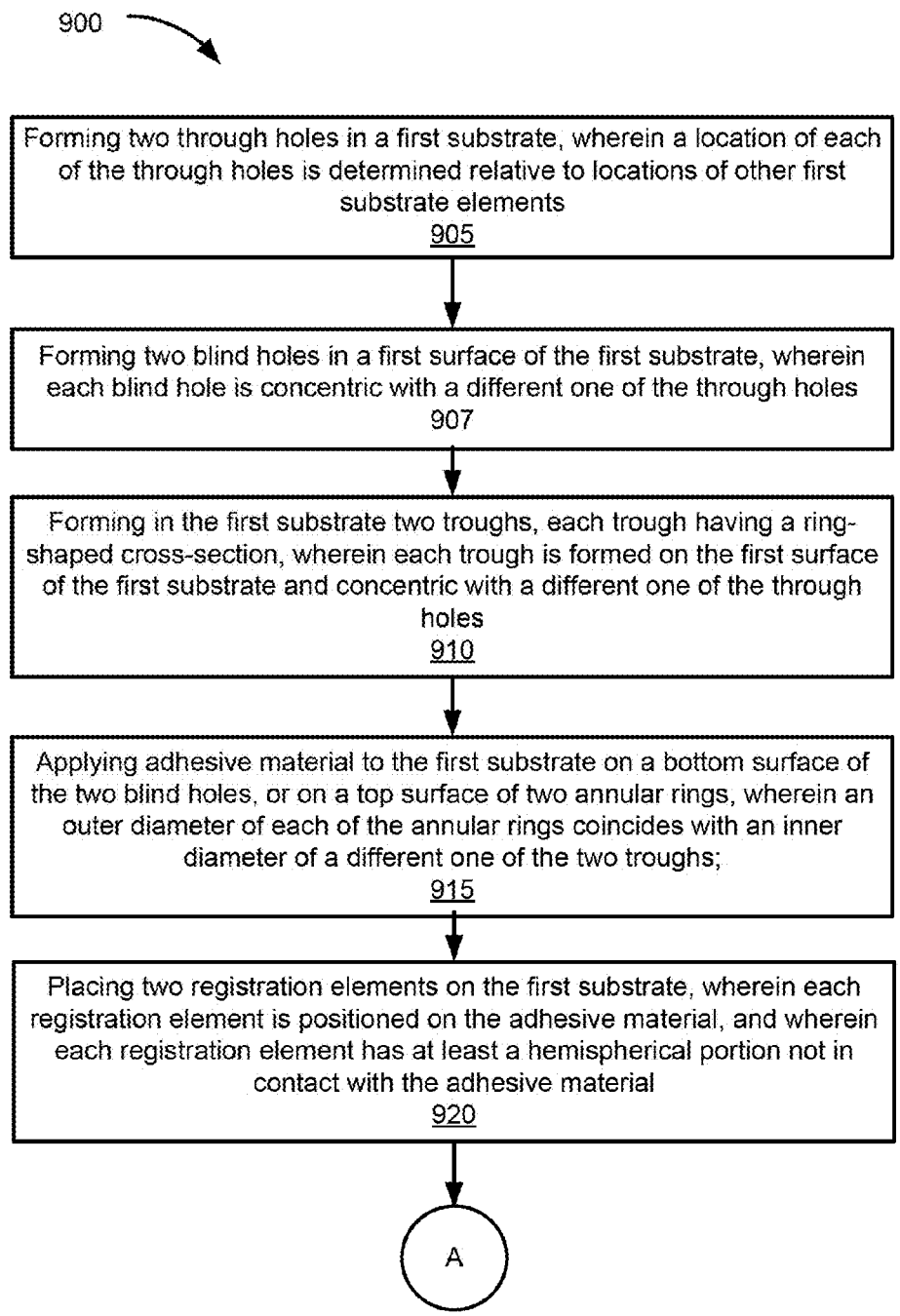
FIG. 9 depicts a flow diagram illustrating an example process of attaching registration elements to a substrate.
Figure 9B:
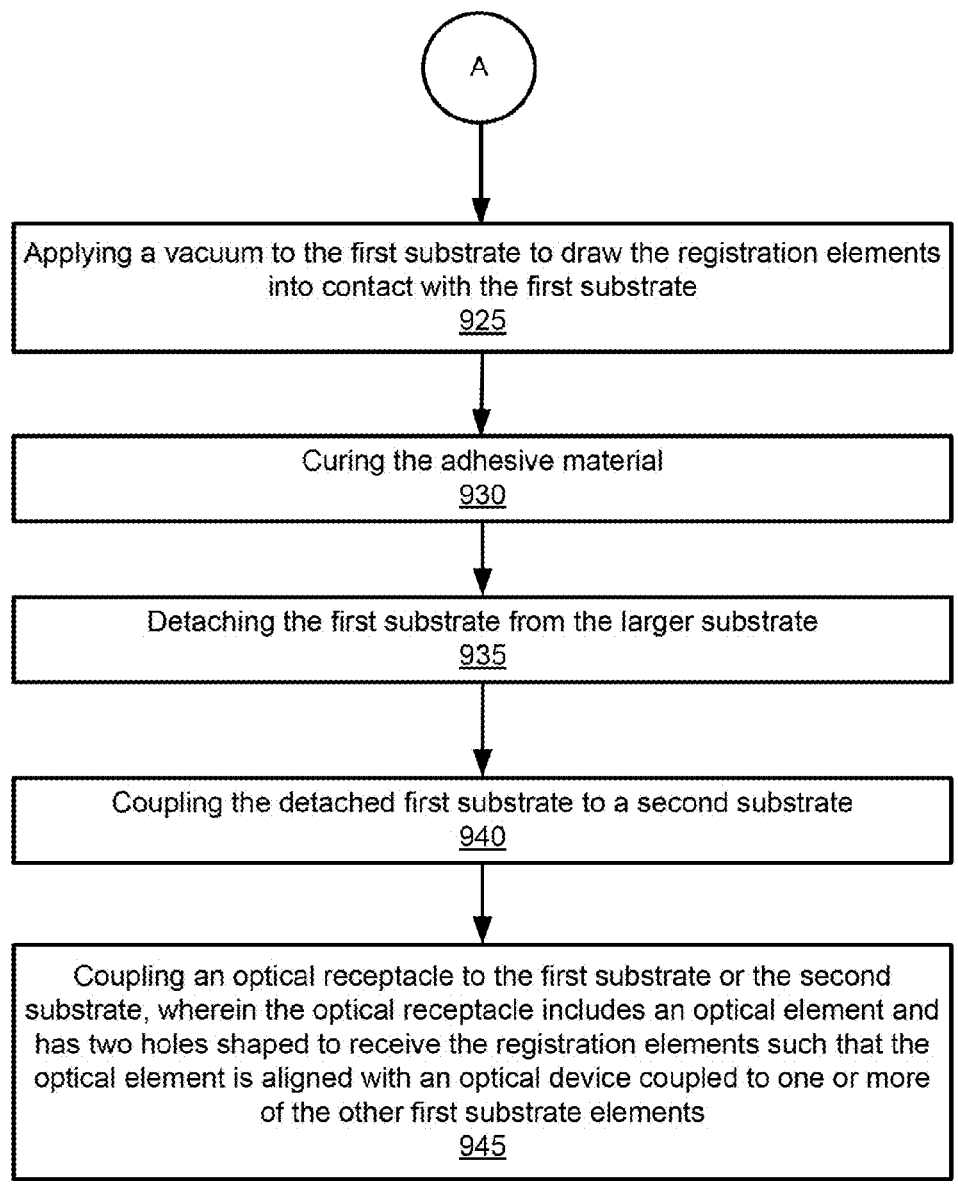

FIG. 9 depicts a flow diagram illustrating an example process 900 of attaching registration elements to a substrate.

At block 905, two through holes are formed in a first substrate. The location of each of the through holes is determined relative to locations of other substrate elements, such as flip chip pads to which active optical devices can be coupled, for example, by using solder reflow to allow self-alignment of the optical devices onto the pads. The other substrate elements can include TSVs, metal traces, and bonding pads through which electrical signals can be sent to and received from the optical devices. Methods by which the through holes can be formed include mechanical drilling, laser ablation, sand blasting, dry etching, and wet etching. Independent of the method of forming, the through holes should be registered precisely to the other substrate elements so that the registration elements are aligned precisely with the active optical devices after they are pulled into contact with the inner edges of rings 145a, 145, 420a, 420b, or blind holes 431a, 431b.

Next, at block 907, two blind holes are formed in a first surface of the first substrate, where each blind hole is concentric with a different one of the through holes. Then at block 910, two troughs are formed in the first substrate. Each trough is ring-shaped and concentric with a different one of the through holes. The troughs are formed on a first surface of the first substrate by removing substrate material.

Next, at block 915, adhesive material is applied on a bottom surface of the two blind holes, or on a top surface of two annular rings, where an outer diameter of each of the annular rings coincides with an inner diameter of a different one of the two blind holes. The adhesive material can be applied, for example, by using a precision dispenser with either a jet or a pressure dispenser, or by selectively coating an adhesive layer at desired locations on the interposer surfaces in a wafer-level process. An appropriately shaped film adhesive may also be laminated onto the substrate.

At block 920, two registration elements are placed on the first substrate, where each registration element is positioned on the adhesive material, and each registration element has at least a hemispherical portion not in contact with the adhesive material.

At block 925, a vacuum is applied to the first substrate to draw the registration elements toward the first substrate, and at block 930, the adhesive material is cured. The vacuum can be applied either prior to or during part or all of the adhesive curing process. Example methods used for curing the adhesive material is the application of light or heat, or through the passage of time without the application of additional light or heat, typically using a chemical catalyst.

At block 935, the first substrate is detached from the larger substrate, for example, by dicing. Then at block 940, the detached first substrate is coupled to a second substrate. For example, adhesive material, solder, or electrical connector can be used to couple the first substrate to the second substrate.

Next, at block 945, an optical receptacle is coupled to the first substrate or the second substrate, where the optical receptacle includes one or more optical elements and has two precision holes, for example, cylindrical or slot-shaped, to receive the registration elements such that the optical elements are aligned with the optical devices.

The techniques presented herein provide a wafer-scale assembly of an electro-mechanical platform capable of achieving precise passive optical alignment of optical elements 750 positioned in an optical receptacle 730 with optoelectronic components 210a, 210b positioned on an interposer 120.

What is claimed is:

1. An apparatus comprising;
   a first substrate comprising
      a plurality of interposers, wherein each interposer comprises;
         a set of interposer elements, wherein an optical device is coupled to at least some of the interposer elements;
         a pair of through holes formed through the interposer, wherein each through hole is registered with respect to the set of interposer elements;
         a pair of blind holes formed in a surface of the interposer, wherein each blind hole is concentric with a different one of the pair of through holes; and
         a pair of annular troughs formed in the surface of the interposer, wherein each annular trough is concentric with a different one of the pair of through holes, and further wherein an annular area separates each of the annular troughs from an outer diameter of the corresponding concentric blind hole; and
         a pair of registration elements, wherein each of the registration elements is positioned on uncured adhesive on a different one of the annular areas, and further wherein each registration element is spherical, wherein the through holes are to enable a vacuum to be drawn through such that the pair of registration elements are pulled toward the surface of the interposer to self-align to the inner diameter of the pair of blind holes either prior to or during at least part of an adhesive curing process.

2. The apparatus of claim 1, further comprising:
   a base substrate, wherein a first interposer detached from the first substrate is coupled to the base substrate; and
   a receptacle having at least one optical element and a pair of openings, wherein the pair of openings are positioned over the pair of registration elements to align the optical element with the optical device.

3. The apparatus of claim 2, wherein the base substrate has a pair of cutouts, and the receptacle has a pair of legs,
   wherein the pair of legs are inserted into the pair of cutouts, and
   wherein the receptacle widens above the pair of legs beyond the dimensions of the cutouts to limit a length of the pair of legs that is inserted into the pair of cutouts such that a height of the optical element over the interposer is controlled.

4. The apparatus of claim 2, wherein the optical element includes a wavelength selective portion.

5. The apparatus of claim 1, wherein the optical device has electrical connections, and further wherein the electrical connections include i) electrical traces on the surface of the interposer; or ii) electrical signal conductors that pass through a through substrate via, and the set of interposer elements includes the through substrate via.

6. A system comprising:
   a substrate comprising:
      a set of substrate elements,
      a pair of positioning apertures formed through the substrate, wherein each positioning aperture is positioned relative to the set of substrate elements;
      an optical device coupled to and positioned relative to the set of substrate elements; and
      a pair of registration objects positioned over the pair of positioning apertures and coupled to the substrate with a joining material, wherein each registration object has at least a hemispherical portion not in contact with the joining material; and
   an optical receptacle having an optical element and a pair of openings positioned over the pair of registration objects such that the optical element is aligned with the optical device;
   wherein the positioning apertures are to enable a vacuum to be applied to the substrate to pull the registration objects into contact with the substrate and align the registration objects to the substrate elements.

7. The system of claim 6, further comprising:
   a pair of raised rings formed on the substrate, wherein each raised ring is concentric with a different one of the positioning apertures, and wherein the joining material is contained within the raised rings and outside of the positioning apertures, or a pair of blind holes formed in the substrate, wherein each blind hole is concentric with a different one of the positioning apertures, and wherein the joining material is placed in the pair of blind holes,
   wherein each of the registration objects is a truncated sphere with a flat surface, and further wherein the flat surfaces of the registration objects are coupled to the substrate via the joining material.

8. The system of claim 6, further comprising:
   a pair of blind holes formed in a surface of the substrate, wherein each blind hole is concentric with a different one of the positioning apertures; and
   a pair of annular channels formed in the surface of the substrate, wherein each annular channel is concentric with a different one of the positioning apertures, and further wherein an annular area separates each of the annular channels from an outer diameter of a corresponding blind hole,
   wherein the joining material is positioned on the annular areas.

9. The system of claim 6, wherein the joining material is cured upon application of the vacuum.

10. A method comprising:
    forming two through holes in a first substrate, wherein a location of each of the through holes is determined relative to locations of other first substrate elements;
    forming two blind holes in a first surface of the first substrate, wherein each blind hole is concentric with a different one of the through holes;
    forming in the first substrate two troughs, each trough having a ring-shaped cross-section, wherein each trough is formed on the first surface of the first substrate and concentric with a different one of the through holes;

applying adhesive material to the first substrate on a bottom surface of the two blind holes, or on a top surface of two annular rings, wherein an outer diameter of each of the annular rings coincides with an inner diameter of a different one of the two troughs;

placing two registration elements on the first substrate, wherein each registration element is positioned on the adhesive material, and wherein each registration element has at least a hemispherical portion not in contact with the adhesive material;

applying a vacuum to the first substrate to draw the registration elements into contact with the first substrate; and curing the adhesive material.

11. The method of claim 10, wherein forming the two through holes and other associated features fabricated by removing substrate material, comprises mechanical drilling, laser ablation, sand blasting, dry etching; or wet etching.

12. The method of claim 10, wherein the first substrate is one of a plurality of first substrates that, are part of a larger substrate, and wherein applying the vacuum comprises applying the vacuum simultaneously to the plurality of first substrates.

13. The method of claim 12, comprising:
detaching the first substrate from the larger substrate;
coupling the detached first substrate to a second substrate; and
coupling an optical receptacle to the first substrate or the second substrate, wherein the optical receptacle includes an optical element and has two holes shaped to receive the registration elements such that the optical element is aligned with an optical device coupled to one or more of the other first substrate elements.

14. The method of claim 13, wherein at least some of the other first substrate elements includes pads, and the method further comprises attaching the optical device to one or more of the pads.

15. The method of claim 13, wherein the other first substrate elements includes a passage formed through the first substrate, and further wherein an electrical signal conductor coupled to the optical device passes through the passage.

* * * * *